United States Patent [19]

Adams et al.

[11] 4,004,528

[45] Jan. 25, 1977

[54] HEAT SINK FOR AN APPLIANCE CIRCUIT BOARD

[75] Inventors: Kenneth Douglas Adams, Madison; Edward Walter Ostapczuk, Union, both of N.J.

[73] Assignee: The Singer Company, New York, N.Y.

[22] Filed: Mar. 26, 1976

[21] Appl. No.: 670,779

[52] U.S. Cl. .................. 112/218 R; 112/258; 165/96; 317/100
[51] Int. Cl.² ................ D05B 71/00
[58] Field of Search .......... 112/258, 218 R, 259; 317/100; 165/80, 96

[56] References Cited

UNITED STATES PATENTS

| | | | |
|---|---|---|---|
| 3,400,677 | 9/1968 | Bowers et al. | 112/219 A |
| 3,676,745 | 7/1972 | Traweek | 317/100 |
| 3,911,327 | 10/1975 | Murari | 317/100 |
| 3,936,704 | 2/1976 | Brenneman et al. | 317/100 X |

*Primary Examiner*—George H. Krizmanich
*Attorney, Agent, or Firm*—Edward L. Bell; Robert E. Smith; Edward P. Schmidt

[57] ABSTRACT

A heat sink arrangement for a circuit board in a sewing machine which supports the circuit board for ready disassembly therefrom, and makes use of the sewing machine frame as an additional heat sink. The circuit board is riveted to an aluminum heat sink member which carrys the power transistors in a manner to provide good thermal conductivity thereto but electrically isolated therefrom by mica laminae. An aluminum bracket firmly affixed to the sewing machine frame for good thermal conductivity has a large area planar surface thereof contiguous a similar large area planar surface of the heat sink member. A clamp member which extends through a slot in the bracket has a pair of upstanding arms with reentrant angles which touch the surface of the heat sink member opposite the large planar surface. The surface of the bracket opposite the large planar surface is formed with a cylindrical surface at an angle to coact with a cone pointed screw carried by the clamp member. As the cone pointed screw bears against the cylindrical surface of the bracket, the heat sink member and the bracket are brought into intimate contact for good thermal conductivity from the transistors to the frame of the sewing machine. A leaf spring may be included as part of the assembly urging the clamp member towards a released position when the cone pointed screw is retracted from the bracket to facilitate disassembly of the circuit board.

4 Claims, 4 Drawing Figures

HEAT SINK FOR AN APPLIANCE CIRCUIT BOARD

BACKGROUND OF THE INVENTION

This invention relates generally to electronically controlled sewing machines and, more particularly to an improved device for limiting the maximum temperature of electronic components therein.

Presently in electronically controlled sewing machines, the electronic components are carried on a plurality of circuit boards supported in the sewing machine frame in specific relation to mechanical or electromechanical components from which they derive information or to which they supply information in the form of electrical signals. Thus, a circuit board which may support a solid state memory and pulse generating components to signal the release of information from the solid state memory would be located adjacent a cam device for initiating pulses supported on the horizontal armshaft of the sewing machine. The power amplifiers and heat sink for the power transistors of the power amplifiers may be carried on a second board in a position where a heat sink for the power transistors may be firmly attached to the sewing machine frame, thereby used as an additional heat sink. Additional circuit boards are required to carry components accessible to a sewing machine operator for selective variation of the sewing parameters or function.

In addition, appearance design of present day household sewing machines favors a clean, uncluttered look, best and most economically achieved by having a sewing machine frame with as few openings as possible, particularly in the front facing a machine operator. Such a design requires considerable resourcefulness in placement of electronic, mechanical and electromechanical components in view of the limited access to the interior of the frame, which is normally not consonant with mass production of a sewing machine.

Lastly, favored Engineering design of sewing machine requires separation of function and control whereby a sewing machine may be assembled with all the required functional components prior to addition of, or interchange of, a control package assembly which may be modified, or added to, to reflect the latest marketing considerations.

What is required is a heat sink arrangement for a sewing machine with a frame having the above noted limited access, which will readily receive or release a heat sink member supporting heat generating devices part of an electronic control package assembly for installation or replacement thereof. Advantageously, the heat sink arragement should make of the sewing machine frame an additional heat sink while also providing support for the electronic control package assembly.

SUMMARY OF THE INVENTION

The above desired ends are achieved in a heat sink device having a bracket thereof firmly attached to a sewing machine bed for good thermal conductivity, at the bottom of the arm standard where the device may provide suppport for an electronic control package assembly positioned in the bracket and standard of the arm. The electronic control package assembly includes a printed circuit board which has riveted to the bottom edge thereof a heat sink member which lies contiguous the bracket affixed to the sewing machine bed. The heat sink member carries power transistors in good thermal conductivity thereto but electrically isolated therefrom by appropriate means such as mica laminae. The transistors are suitably connected to the printed circuit board. The bracket is fashioned with a slot in its lowermost extremity through which extends a clamp member. The clamp member has a pair of upstanding arms at reentrant angles to the body thereof which bear against the heat sink member on the side opposite that contiguous the bracket. The body of the clamp is tapped to carry an upwardly directed cone pointed screw which coacts with an angled cylindrical surface on the bracket opposite that contiguous the heat sink member. Thus when the cone pointed screw, which is accessible from the open bottom of the sewing machine frame, bears against the cylindrical surface on the bracket, the arm of the clamp member is forced against the heat sink member, thereby to create a pressure contact between the heat sink member and the bracket.

DESCRIPTION OF THE DRAWINGS

Figure 1:
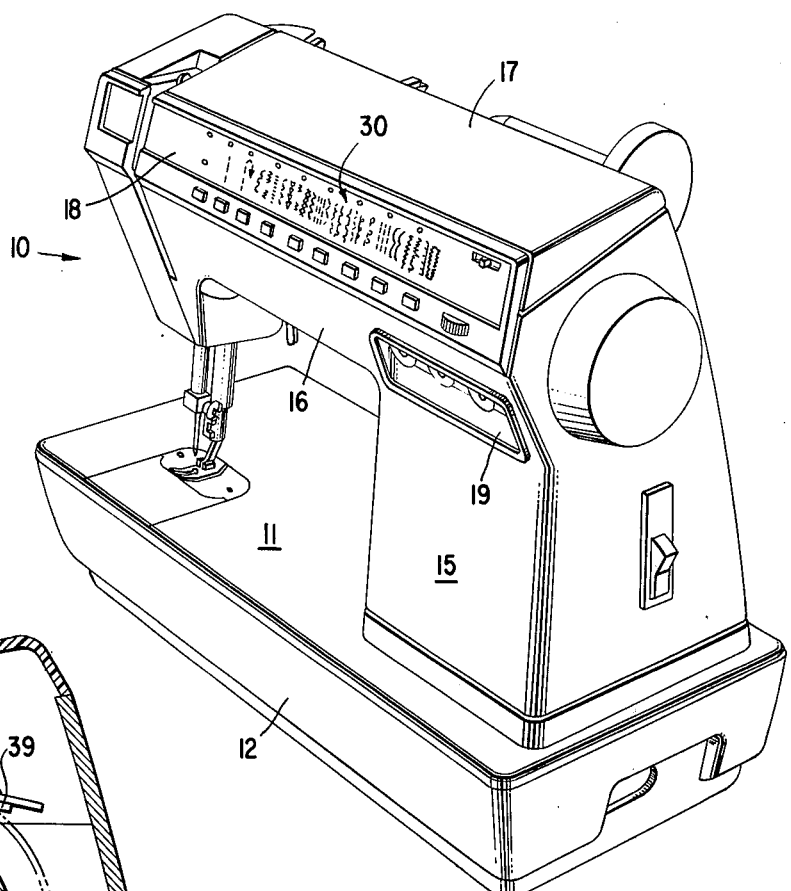

Having thus described the present invention, the above and further features and advantages will be recognized by those familiar with the art from the following detailed description of a preferred embodiment illustrated in the accompanying drawings and representing the best mode presently contemplated so as to enable those skilled in this art to understand and practice the invention.

Figure 2:
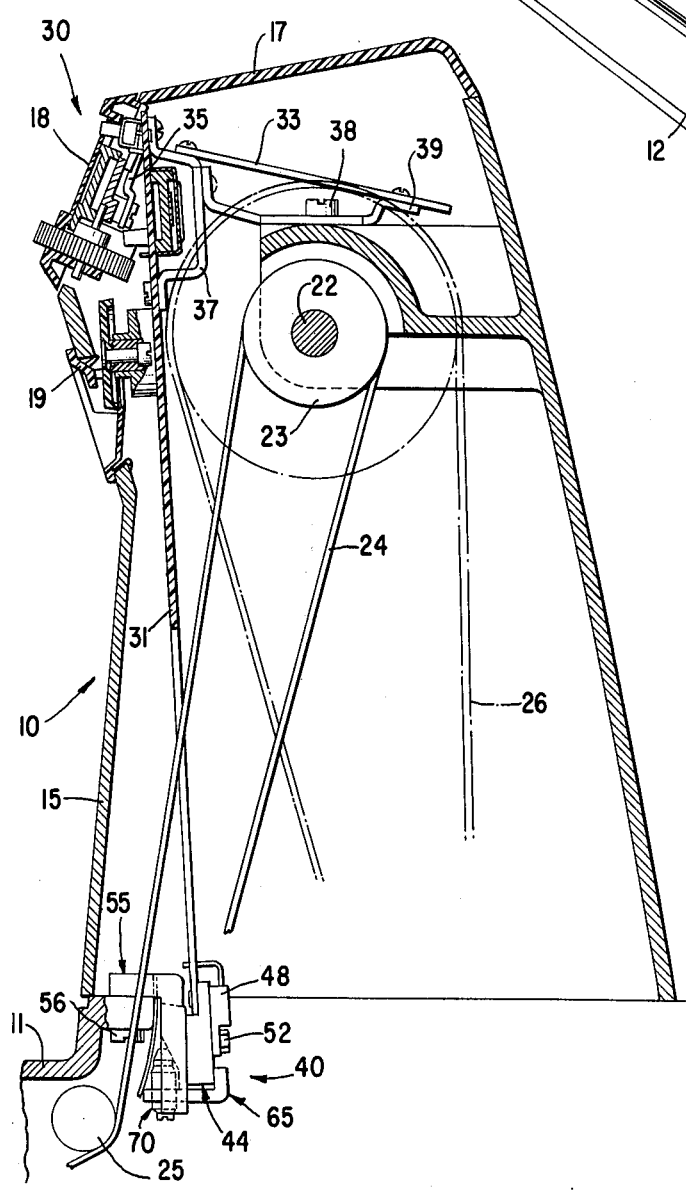
Figure 3:
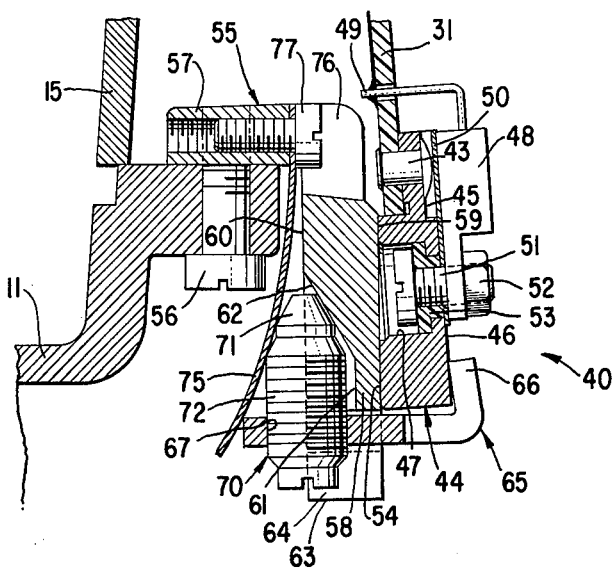
Figure 4:
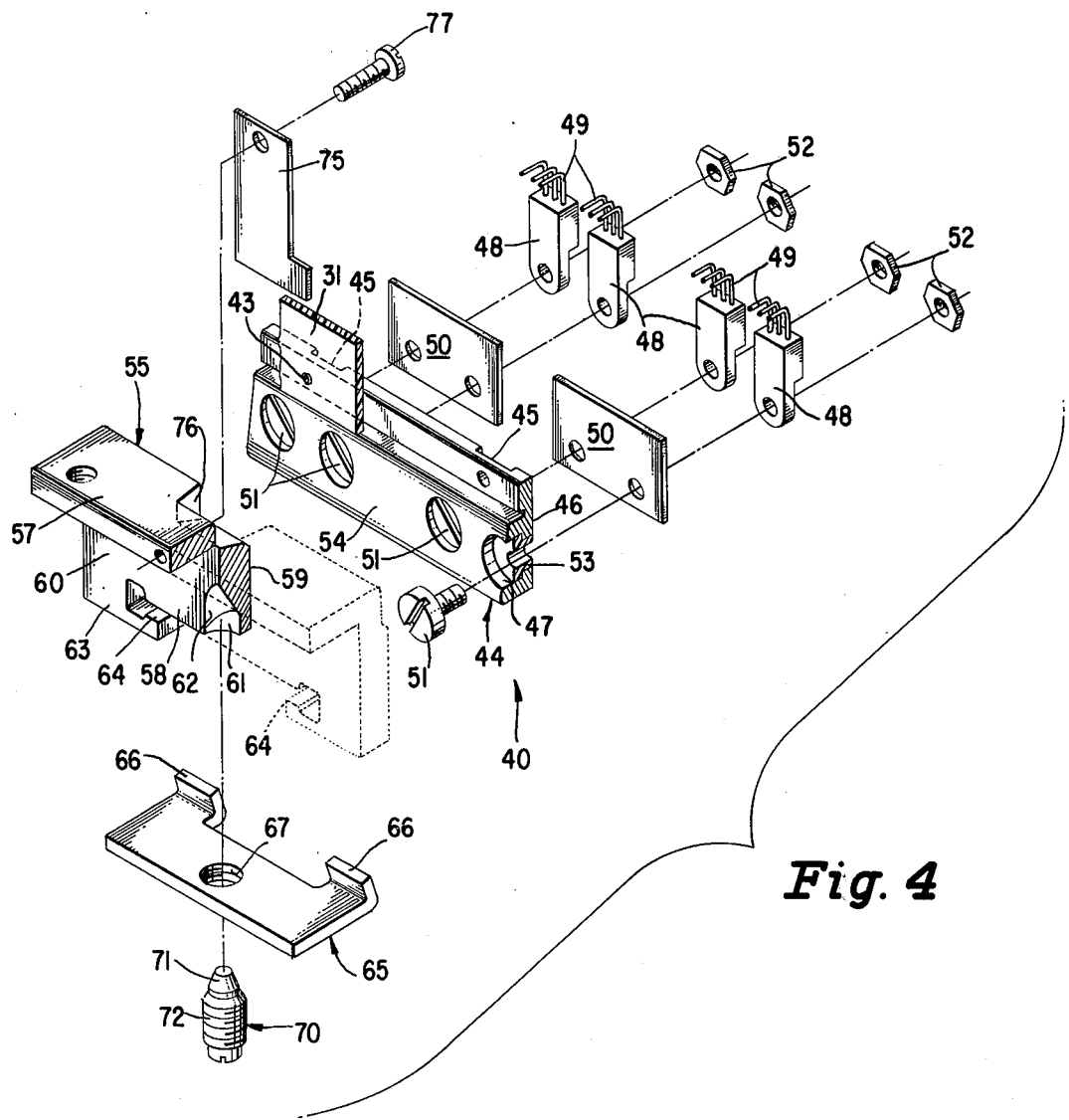

In the drawings:

FIG. 1 is a perspective view of a sewing machine in which this invention may be utilized;

FIG. 2 is a cross section through the standard of the sewing machine of FIG. 1 showing the location of the heat sink arrangement in relation to the printed circuit board part of the electronic control package;

FIG. 3 is an enlarged cross section of the heat sink arrangement showing the details thereof; and, FIG. 4 is a disassembled perspective view of the heat sink arrangement showing more clearly the interrelation of the various parts.

Referring to FIG. 1 there is shown a sewing machine 10 having a bed 11 supporting a standard 15 from which extends a bracket arm 16 overhanging the bed. The bed 11 is cast with an open bottom normally enclosed by bed cover 12 for appearance sake. Similarly, the bracket arm 16 is cast with an open top normally covered by a top cover 17 and control panel 18. An auxiliary panel 19 covers an additional small opening in the front of the standard through which project controls for operator variation of sewing parameters. Thus, it is apparent that the assembly of the sewing machine 10 is accomplished almost exclusively by access from the top or bottom thereof prior to installation of the top cover 17, control panel 18 and bed cover 12.

In FIG. 2 is shown a cross section of the sewing machine shown in FIG. 1 taken through the standard 15 thereof. In this view some of the mechanical components of the sewing machine 10 are visible including the horizontal armshaft 22 and drive pulley 23 connected by belt 24 to sewing instrumentalities and a feed system (not shown) in the bed of the sewing machine. An idler pulley 25 is shown which permits the belt to be directed forwardly in the bed 11. Also shown in phantom is a drive belt 26 connecting the armshaft 22 to a drive motor (not shown).

More importantly, in FIG. 2 is seen an electronic control package 30 consisting of the control panel 18, printed circuit board 31 supporting the control circuitry thereon (not shown for simplicity), printed circuit board 33 supporting primarily power supply circuitry and pulse generating circuitry (also not shown for simplicity); and brackets 35 supporting the control panel attached to the control board 31, support 37 for the power supply board 33 attached to the control board 31, and brace 39 attached to support 37 and the power supply board 33 and providing attachment to the standard 15 by means of screw 38. At the lower extremity of the control circuit board 31 is shown a heat sink arrangement 40 which provides additional support for the electronic control package 30.

In FIG. 3 is shown an enlarged cross section of the heat sink arrangement 30 of FIG. 2, which when viewed with the disassembled perspective of FIG. 4 may give a clearer understanding of the operation and advantages of the device. Thus in FIG. 3 is shown the control circuit board 31 attached by rivets 43 to a heat sink member 44 having grooves 45 therein to accommodate the heads of the rivets below the outer surface 46 thereof. The heat sink member 44 is fashioned from a good heat conducting material, preferably aluminum. Power transistors 48, electrically connected to the control circuit board 31 at 49, are firmly attached to the outer surface 46 of heat sink member 44 by screws 51 sitting in counterbores 47 of the heat sink member, and nuts 52. Mica laminae 50 interposed between the power transistor 48 and the outer surface 46 of the heat sink member 44 permits good thermal conductivity between the transistors and the heat sink member, while maintaining electrical isolation thereof. An insulating bushing 53 situate under the head of the screw 51 in the counterbores 47 of the heat sink member 44 provides electrical isolation of the screw from the heat sink member.

Also visible in FIGS. 3 and 4 is a right angle bracket 55, also fashioned from a good heat conducting material preferably aluminum. The bracket 55 has a machine surface on one arm 57 thereof firmly connected to a machined surface of the bed 11 by a plurality of screws 56 to establish good thermal conductivity between the bracket and bed. A second arm 58 of the bracket 55 has an inner machined surface 59 thereof arranged to lie contiguous an inner machined surface 54 of the heat sink member 44.

A clamp member 65, fashioned from a strong rigid material such as steel, is formed with a pair of upstanding arms 66 at either end thereof which impinge on the outer surface 46 of the heat sink member 44. The main body of the clamp member 65 extends beneath the heat sink arrangement 40 and contains a tapped hole 67 to receive a cone pointed screw 70 in approximate axial alignment with the outer side 60 of the bracket 55 opposite the inner machined surface 59. The outer side 60 of the bracket 55 is formed with a cylindrical groove 61, to acommodate the cone pointed screw 70, which groove blends into a second angled cylindrical groove 62 running at an angle substantially parallel to the cone pointed screw to cooperate therewith. The bracket 55 is further formed with extensions 63 on either end thereof which terminate in inwardly directed ears 64 which extend beneath the clamp member 65 and give support to the clamp member against the thrust of the cone point 71 of the cone pointed screw 70 bearing against the angled cylindrical groove 62.

Thus as the cone pointed screw 70 is turned to have the cone point 71 bear against the angled cylindrical groove 62 of the bracket 55, the thrust of the screw is taken up by the inwardly directed ears 64 of the bracket, and the clamp member 65 is forced to the left, as viewed in FIG. 3. By reason of the action of the upstanding arms 66 of the clamp member 65 pressing against the outer surface 46 of the heat sink member 44, the inner machined surface 54 thereof is brought into intimate pressure contact with the inner machined surface 59 of the bracket 55 under the influence of the combined mechanical advantage of the screw threads 72 of the cone pointed screw 70 in the clamp member and the ramp action of the cone point 71 of the screw against the angled cylindrical groove 62 of the bracket. In this manner the contact coefficient of thermal conductivity can be increased many fold to establish extremely good heat conductivity between the heat sink member 44 and the bracket 55.

As may be noted in FIGS. 2 and 3 the cone pointed screw 70 is positioned vertically and may be reached for loosening or tightening by removing the bed cover 12 from the bed 11. A leaf spring 75 is positioned within a channel 76 at the juncture of the first arm 57 and second arm 58 of the bracket 55, and is affixed to the first arm 57 by means of a screw 77. The leaf spring 75 bears against the cone point screw 70 and the clamp member 65; and, as the cone point screw is retracted, urges the clamp member in a direction to release the pressure contact between the heat sink member 44 and the bracket 55, thus facilitating disassembly thereof.

Thus has been described a heat sink arrangement which includes the appliance as part of the heat sink, while simultaneously providing support for an electronic package in an area to which there is limited access. It will be apparent to one skilled in the art that other clamp member arrangements are possible wherein a cone pointed screw 70 would bear against a suitably configured heat sink member 44, or wherein a screw may be selected which will act from other directions to accommodate a change in the location of the access opening. For example, a U-shaped clamp member may be utilized wherein a screw carried by one leg of the U may bear directly against a bracket 55 or heat sink member 44. Also, the cone pointed screw 70 may be carried by the bracket 55, with the cone point 71 of the screw bearing against a ramp surface of the clamp member 65 to create the desired intimate contact between the heat sink member 44 and bracket 55.

Having thus set forth the nature of the invention what we seek to claim is:

1. A heat sink arrangement for an appliance having a heat conducting frame with at least one access opening to the interior thereof, and controlled by an electronic assembly including heat dissipating components disposed internally of said frame, the heat sink arrangement comprising:

heat conducting bracket means affixed to said frame of said appliance for good heat conduction thereof, said bracket means having a first surface and a second surface substantially oppositely disposed to said first surface;

heat conducting heat sink means attached to said electronic assembly and supporting said heat dissipating components for good thermal conductivity but electrically isolated therefrom, said heat sink means having a first surface disposed contiguous and congruent said first surface of said bracket means, said heat sink means having a second surface substantially oppositely disposed to said first surface of said heat sink means; and, clamping means for pressing said bracket means to said heat sink means for good thermal conductivity and support of said electronic assembly, said clamping means having a portion thereof abutting one of said second surfaces and including a screw thread device in adjustable pressure contact with the other of said second surfaces in opposition to said portion of said clamping means, said screw thread device being accessible from an access opening.

2. A heat sink arrangement for an appliance having a heat conducting frame with at least one access opening to the interior and controlled by an electronic assembly including heat dissipating components disposed internally of said frame, the heat sink arrangement comprising:

heat conducting bracket means affixed to said frame of said appliance for good heat conduction thereto, said bracket means having a first surface and a second surface substantially oppositely disposed to said first surface but having at least a portion thereof tapering toward said first surface to one extremity of said bracket means, said extremity of said bracket means being formed with support means;

heat conducting heat sink means attached to said electronic assembly and supporting said heat dissipating components for good thermal conductivity but electronically isolated therefrom, said heat sink means having a first surface disposed contiguous and congruent said first surface of said bracket means, said heat sink means having a second surface substantially oppositely disposed to said first surface thereof; and, clamping means for pressing said bracket means to said heat sink means for good thermal conductivity and support of said electronic assembly, said clamping means being supported by said support means on said extremity of said bracket means, said clamping means having an arm thereof abutting said second surface of said heat sink means and including a screw thread device in adjustable pressure contact with said tapered portion of said second surface of said bracket means in opposition to said arm of said clamping means, said screw thread device being disposed accessible from an access opening.

3. In a sewing machine having a heat conducting frame with top and bottom access openings therein, said frame supporting sewimg machine functional components therein and an electronic control package for control of said functional components insertable from said top access opening, said electronic control package including heat dissipating components, a heat sink arrangement comprising:

a heat conducting bracket means affixed to said frame for good thermal conductivity thereto and accessible from said bottom access opening, said bracket means having a first surface and a second surface oppositely disposed to said first surface;

a heat conducting heat sink means attached to said electronic control package and supporting said heat dissipating components for good thermal conductivity but electrically isolated therefrom, said heat sink means having a first surface disposed contiguous and congruent said first surface of said bracket means, said heat sink means having a second surface substantially oppositely disposed to said first surface of said heat sink means; and, clamping means for pressing said bracket means to said heat sink means for good thermal conductivity and support of said electronic control package, said clamping means having a portion thereof abutting one of said second surfaces and including a screw thread device in adjustable pressure contact with the other of said second surfaces in opposition to said portion of said clamping means, said screw thread device being accessible from an access opening.

4. In a sewing machine having a heat conducting frame with top and bottom access openings therein, said frame supporting sewing machine functional components therein and an electronic control package for control of said functional components insertable from said top access opening, said electronic control package including heat dissipating components, a heat sink arrangement comprising:

a heat conducting bracket means affixed to said frame for good thermal conductivity thereto and accessible from said bottom access opening, said bracket means having a first surface and a second surface substantially oppositely disposed to said first surface but having at least a portion thereof tapering toward said first surface to one extremity of said bracket means, said extremity of said bracket means being formed with support means;

a heat conducting heat sink means attached to said electronic control package and supporting said heat dissipating components for good thermal conductivity but electrically isolated therefrom, said heat sink means having a first surface disposed contiguous and congrument said first surface of said bracket means, said heat sink means having a second surface substantially oppositely disposed to said first surface of said heat sink means; and, clamping means for pressing said bracket means to said heat sink means for good thermal conductivity and support of said electronic control package, said clamping means being supported by said support means on said extremity of said bracket means, said clamping means having a portion thereof abutting said second surface of said heat sink means and including a screw thread device in adjustable pressure contact with said tapered portion of said second surface of said bracket means in opposition to said portion of said clamping means, said screw thread device being disposed accessible from an access opening.

* * * * *